United States Patent [19]
Chatard

[11] Patent Number: 5,268,583
[45] Date of Patent: Dec. 7, 1993

[54] HOMOGENIZING ELECTRICAL SIGNALS GENERATED BY A DETECTION SYSTEM AND TRANSMITTED TO AN EXPLOITING SYSTEM

[75] Inventor: Jean P. Chatard, Yerres, France

[73] Assignee: Sofradir - Societe Francaise de Detecteurs Infrarouges

[21] Appl. No.: 925,996

[22] Filed: Aug. 6, 1992

Related U.S. Application Data

[63] Continuation-in-part of Ser. No. 521,740, May 10, 1990, abandoned.

[30] Foreign Application Priority Data

May 16, 1989 [FR] France .................. 89 06620

[51] Int. Cl.$^5$ .................... H01L 29/78; G11C 19/28
[52] U.S. Cl. ................... 257/229; 257/230; 257/241; 257/249; 377/57; 377/60; 377/62
[58] Field of Search ............... 257/229, 233, 249, 230, 257/241; 377/57, 60, 62, 63

[56] References Cited

U.S. PATENT DOCUMENTS

| | | | |
|---|---|---|---|
| 3,969,634 | 7/1976 | Su et al. ............... | 257/229 |
| 4,331,889 | 5/1982 | Parrish ................ | 257/229 |
| 4,375,597 | 3/1983 | Kosonocky ............ | 257/215 |
| 4,539,597 | 9/1985 | Kinoshita etal. ....... | 257/229 |
| 4,684,800 | 8/1987 | Morse et al. .......... | 357/24 |
| 4,994,876 | 2/1991 | Hisa .................. | 257/229 |
| 5,003,565 | 3/1991 | Yoshida ............... | 257/233 |
| 5,060,245 | 10/1991 | Nelson ................ | 257/233 |

FOREIGN PATENT DOCUMENTS

| 1480118 | 5/1989 | U.S.S.R. ............... | 377/60 |
|---|---|---|---|
| 1040947 | 12/1989 | U.S.S.R. ............... | 377/60 |

OTHER PUBLICATIONS

IEEE Transactions on Electron Devices, vol. ED-29, No. 1, (1982) pp. 3-13; "Hybrid Infrared Focal-Plane Arrays".

Primary Examiner—Rolf Hille
Assistant Examiner—Mahshid Saadat
Attorney, Agent, or Firm—Wall and Roehrig

[57] ABSTRACT

An exploiting or readout circuit for a linear or matrix type photodetector array is of the multiplex type, such as a charge-coupled device (CCD). The exploiting circuit has a number of input stages corresponding to the number of photodetectors or similar photosites, and the gains of the input stages are established as a function of the fields of view of their associated photodetectors. In one embodiment the input stages each comprise a storage device formed of a first and a second storage electrode separated by a dividing electrode, the storage electrodes having respective surface areas selected in a relation that varies as a function of solid angle field of view of the respective photodetector. In another embodiment the input stage can include an OpAmp with a negative feedback capacitor whose value is selected as a function of the viewing solid angle of the respective photodetector.

8 Claims, 3 Drawing Sheets

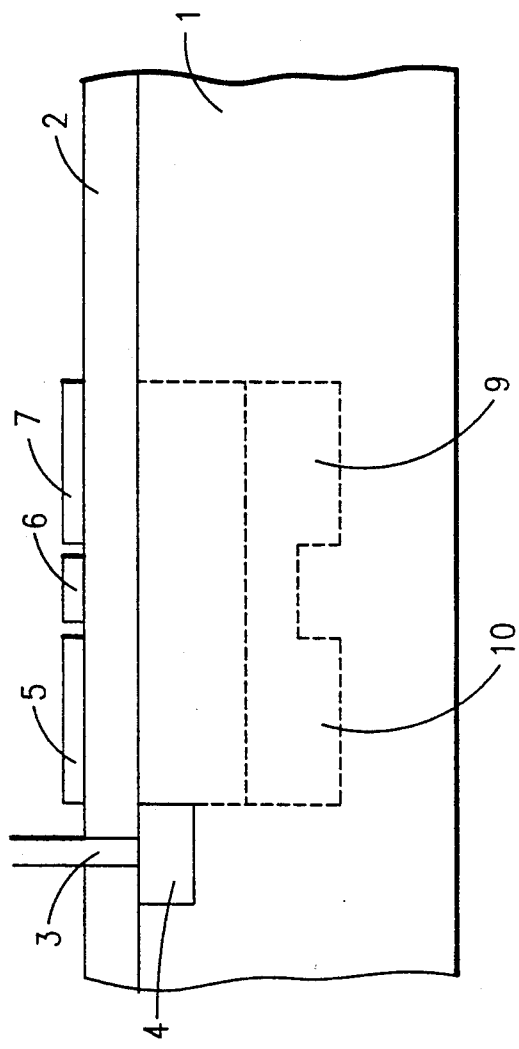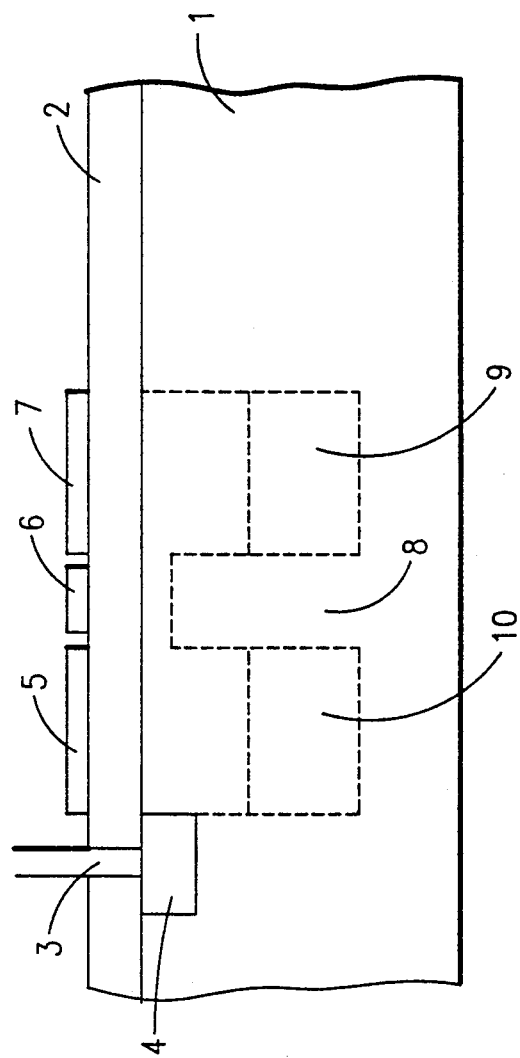

HOMOGENIZING ELECTRICAL SIGNALS GENERATED BY A DETECTION SYSTEM AND TRANSMITTED TO AN EXPLOITING SYSTEM

This is a continuation in part of my earlier copending patent application Ser. No. 07/521,740, filed May 10, 1990, now abandoned.

BACKGROUND OF THE INVENTION

The present invention relates to a method intended to allow the homogenizing of electrical signals generated by a detection system and transmitted to an exploiting device of the multiplexer type, for example, a charge-coupled device (CCD). It applies more particularly to the processing signals generated by an array of photodetectors such as photodiodes whose photosides have a solid angle of view different from one site to another. Even more specifically, this invention applies to infrared detectors which, provided with their readout circuits, are assembled in a cryogenic enclosure.

An exploiting or readout device or readout circuit is known in the art to mean a circuit for reading and time-shifted processing (multiplexing) of the various signals passing through this circuit.

It is well understood that the electro-optical performance of photodetectors, and particularly infra-red detectors, is improved by limiting their useful solid angle, also called the field of view. This limitation is most often carried out by diaphragms having an opening adapted to the spatial structure of the assembly formed by the detectors. It is also possible to use an optical system called an "aperture transfer" system, but this type of device is complex and expensive.

The use of such detection systems provided with a diaphragm, in particular for assemblies of large size, whether they are linear arrays or matrices, creates viewing aspects of the opening of the diaphragm by the photosites at an angle of view which is different from one photosite to another, the latter reducing with the distance of the photosite from the optical axis of the system. The solid angle of view or field of view of each of the photosites can be broken down into two separate solid angles, one called the useful angle of view or the "signal" angle of view enclosing the optical system preceding the diaphragm and the other called the "parasitic" solid angle of view containing the radiation limited by the diaphragm which cannot pass through the optical system and is reflected by the hot and cold parts of the enclosure of the dewar, of the diaphragm or of the detectors, or emitted by the hot parts of the dewar. In this way, for an observed homogeneous background, the photon flux reaching each detector is fluctuating and varies with the position of the latter, as this flux is proportional to the solid angle or field of view. This inconsistency affects either the signal field of view and the parasitic field of view or, more particularly, the parasitic field of view in the case of special optical systems. In fact, the continuous response of the system is made inconsistent by it and it harms the functioning of the system. In other words, the response of the system observing a homogeneous background is not itself homogeneous.

It has been proposed in French published patent application 2,613,831 to limit or even to eliminate this source of inconsistency by varying the surface area of the photosites in such a way that the product of the solid angle of view and the area of each of the photodetectors is constant, thus representing the constancy of the photon flux for all of the photosites at the level of the detection. However, these photodetectors having different surface areas have different electrical properties, particularly when these detectors are photodiodes. In fact, the inconsistency is removed at the level of the detection. On the other hand, the electrical and spatial characteristics are not constant from one photodetector to another. In this way, even if the problem of homogeneity is solved at the level of the detection, this problem is transferred to the exploitation level. The problem has in fact only been shifted. For example, in the case of photodiodes, the reverse dynamic resistance, the short-circuit current, the saturation current and the original resistance of each of the diodes vary as a function of the surface area of the latter resulting in an inconsistent functioning of the readout circuit. The use of such a structure therefore becomes very complex.

In order to improve the results of an imaging device, it is known to induce at the level of the exploiting circuit either a division, also called partitioning, of the created charges or a lowering, also called skimming, of the latter in order to use only a more reduced number of charges for the purpose of eliminating, or of reducing the background noise. This type of device is for example, described in European Patent documents A-0-148,086 and A-0,251,386. However, this type of device is still of limited use, taking account of the fact that the processes are performed independently from the photon flux dispersions. In fact, in the European Patent document 0,251,386 for example, implementation assumes the use of a reference charge generator capable of simulating a homogeneous background. There is therefore no correlation between the incident photon flux and the division and/or lowering.

There has also been described in the publication by Chow et al in IEEE TRANSACTIONS ON ELECTRON DEVICES (vol. ED 29, No 1, January 1982, pages 3-13), a conventional input stage of a CCD provided with a lowering function and a division function, and an input stage with a feed-back amplifier intended to compensate for the detection diodes exhibiting a low reverse resistance. Once again, the signal supplied and analyzed takes no account of the incident photon flux and cannot therefore validly modulate this signal as a function of the positioning of the detection circuit.

These techniques are described for exploiting circuits of the CCD type, which carry out a current/charge conversion of the current from the photosites. These techniques are also practiced, without modifying the analysis thereof, for exploiting circuits carrying out a current/voltage conversion of the current from the photosites.

OBJECTS AND SUMMARY OF THIS INVENTION

The present invention aims at overcoming these various disadvantages. It proposes an exploiting system intended to overcome inherent inconsistencies particularly in the variations in their field of view, and more particularly fixed inconsistencies in the continuous response of a detection system, and to do this without intervening at the level of the detection section of the device but rather at the level of the actual readout circuit, which is located downstream of the associated detection section.

The present invention therefore relates to an exploiting system, intended to homogenize the continuous response of a detection system comprising a linear or matrixlike plurality of photodetectors, said exploiting system, of multiplexer type, that is to say, intended to allow time shifted processing (multiplexing), comprising as many input stages as photodetectors of the detection system to which it is coupled, said input stages being defined by their gain.

This exploiting system is one in which the gain of each input stage is adapted by design to the photodetector to which it is coupled, and from which it receives an electrical signal dependent on the incident photon flux which the photodetector receives. The exploiting system design takes into account the inconsistencies in field of view from one photodetectors to another, and more generally accommodates the fixed dispersions of the continuous response.

The gain of each input stage of the circuit constituting the exploiting system is generally less than unity. By acting on the gain, it is possible in fact to extract, for each photosite, a specified fraction of charge, or to obtain a fraction of the voltage representative of the current transmitted to the input stage, this fraction varying from one input stage to the other as a function of the angle of view of the photosite to which it is coupled. The fraction obtained for each input stage is however unalterable and therefore remains constant. In fact, the deviation in incident flux from one photosite to another remains constant as a proportion, so that to obtain homogeneity in the response of the exploiting system it is required to also keep the modification of the gain of the corresponding input stages constant.

The means to effect these variances in gain, according to the exploiting circuit, and as a function of its technology of manufacture, can take various forms. The invention applies to circuit whose gain function involves at least one capacitance, incorporated in the input stage of the exploiting circuit, and which capacitance is varied, as a function of the desired variation in gain. This gain variation is achieved by matched variation of the surface area of the electrode of this capacitance.

In one embodiment of the invention, in which the exploiting circuit is a charge coupled device (CCD), the gain is obtained by division of the storage electrode of the input stage, and its adaptation results from the embodying of the storage electrode according to a specified surface area set by design. In this way, for whatever current that represents the signal coming from the photosite, the proportion of charges transferred to the remainder of the exploiting circuit is constant. In fact the variation in the surface area of the storage electrodes, from one input stage to the next, correspondingly induces a variation in the capacitance of the capacitor constituted by the storage electrode, this variation acting directly at the level of the gain, and being established to depend on the fixed inconsistencies, known or predictable, of the signal coming from the detection system.

In a second embodiment, the exploiting system is embodied in CMOS technology, and the adapting of the gain at each input stage is carried out by means of an operational amplifier mounted in a negative feedback loop at the level of the input stage. The negative-feedback loop incorporates a capacitor, whose capacitance is fixed and specified for each relevant input stage, taking into account the field of view of the photosite to which it is coupled.

The way in which the invention may be embodied and the advantages which result from it will emerge from the examples embodied below, given by way of indication and in a non-limitative way with reference to the appended figures.

BRIEF DESCRIPTION OF THE DRAWINGS

FIGS. 1 and 2 are diagrammatic representations of an exploiting circuit of the CCD type, according to the prior art, in which the gain function is obtained by division.

DESCRIPTION OF THE PREFERRED EMBODIMENT

Figure 3:
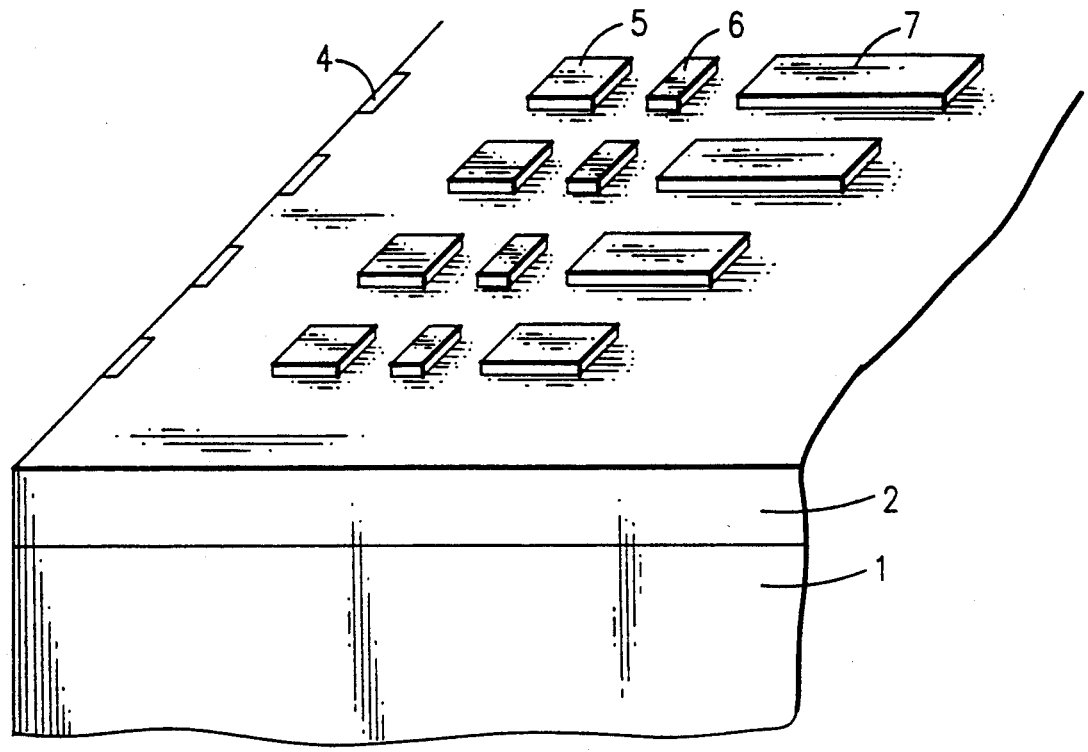
FIG. 3 is a diagrammatic representation of the surface of the input stage of a CCD exploiting system, in which the gain function is obtained by modifying the surface area of one of the storage electrodes.

As can be seen in FIGS. 1 and 2 which represent, for example, the functioning of a circuit of the charge coupled device type, there is shown a silicon substrate 1 layer 2 on which rests a layer 2 produced from silica $SiO_2$ and which constitutes an electrical insulator. The electrical signal coming from the photodetector, in this case a photodiode, is taken by a connection 3 at the level of a zone 4 which constitutes the charge injection zone. The charges thus injected are stored under electrodes (also called grids) 5 and 7 called storage electrodes. An electrode 6 is called the "dividing electrode".

In the initial state called the "storage phase", the three electrodes 5, 6, 7 are taken to potentials such that the charges are uniformly distributed (See FIG. 1). The distribution of the electrical potential i.e., of charge carriers, in the material is represented by dots. These charges or charge carriers thus fill a potential well.

FIG. 2 shows the phase called the "division" phase. During this phase, the dividing electrode 6 is taken to a potential close to zero volts, creating because of this a potential barrier 8, and separating the stored charges into two respective quantities, one being a useful quantity 9 and the other being a useless quantity 10. Only the quantity 9 of useful charges is subsequently used by the readout circuit. It is temporarily stored under the storage electrode 7.

The relative proportions of these two quantities of charges thus separated are expressed by the property called the division coefficient defined as the ratio of the surface areas $S_7/(S_5+S_7)$, $S_5$ and $S_7$ representing the respective surface areas of the storage electrodes 5 and 7. This ratio constitutes the gain of the input stage. By definition it is therefore less than unity.

In this particular case the present invention can consist in adapting the division coefficient of the input stage of an exploiting device serving as a readout circuit for the purpose of the subsequent processing of signals transmitted by a detection system, in order to correct the fixed inconsistencies in incident photon flux, particularly as a function of the position of the photodetector in the array or matrix of photodiodes.

FIG. 3 is a diagrammatic representation of the surface on the input stage of a CCD. The storage electrodes 7 have a variable surface area, depending on the photosites to which they are respectively coupled. Thus, during the manufacture of the readout circuit, a photolithography mask is employed in the step of creating the electrodes 5 and 7 having appropriate surface areas corresponding to the respective desired surface areas $S_5$, $S_7$. These various surface areas, jointly with the substrate, define capacitors also having different capacitances being materialized through a different effective gain. In fact, a stage-by-stage modification of the input capacitance (storage capacitance) is thus obtained, and this modification is achieved by varying the surface area of one of the electrodes 5, 7 i.e., one of the two capacitors constituting this input capacitance.

It is simple to adapt the determination of the variation of the surface areas to the law of variation of the solid angle of view, the latter varyinq from one type of device to another.

In this way, for a device constituted by photodetectors of constant surface area S, each of these photodetectors receive a photon flux at solid angles of view which are variable and known $\Theta_l, \ldots \Theta_i, \ldots \Theta_n$, the photon flux received by each of the detectors is proportional to the respective product, i.e., $\Theta_l.S, \ldots \Theta_i.S, \ldots \Theta_n.S$.

Each of the photodetectors then injects into the input stage of the line of the exploiting circuit which is allocated to it, a quantity of charge Q such that: $Q_l = A.\Theta_l.S$, $Q_i = A.\Theta_i.S$, $Q_n = A.\Theta_n.S$ (A being a constant in these expressions).

These quantities of charge are separated by division, the quantities of transferable useful charge being defined by the expression (for the $i$th line of the exploiting circuit):

$$Q_i = Q_i \frac{S_5^i}{S_5^i + S_7^i} = A \cdot S \cdot \theta_i \frac{S_5^i}{S_5^i + S_7^i}$$

These quantities are all made identical, the surface areas $S^i_5$ and S of the storage electrodes 5 and 7 being such that the product $$\theta_i \cdot \frac{S_5^i}{S_5^i + S_7^i} \text{ is constant.}$$

In other words, for each given photodetector, the product of the gain or division coefficient of the associated exploiting circuit stage, times the solid angle of view $\Theta_i$ for such photodetector, is a constant.

In practice, because of the specific features of each device and the complexity of the observed and detected phenomena (linear array or matrix, size of detection circuit, operating wavelength, readout frequency, etc.) the law of variation of electrode areas can be only partly evaluated a priori, the optimum of this variation law only being determined by experimentation following, for example, a first order approximation.

Advantageously, and as has been represented in FIG. 3, the surface area of one of the electrodes is fixed for the entire circuit, for example the surface are of the electrode 5, and only that of the electrode 7 is varied.

Figure 4:
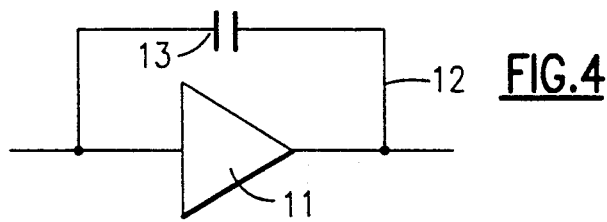
FIGS. 4 and 5 are diagrammatic representations of an exploiting circuit carrying out a current-voltage conversion, embodied with CMOS technology, and in which the gain function is achieved by negative feedback of an operational amplifier.

FIG. 4 represents the basic diagram of the input stage of an exploiting circuit according to another embodiment of the invention. This input stage consists of a trans-impedance operational amplifier 11 carrying out the current-voltage conversion from the current relating to the signal transmitted from the associated photosite. This amplifier is mounted in a negative-feedback mode, with a negative feedback loop 12 comprising a capacitor 13. It is at the level of the loop 12 that the gain is defined, the capacitance of the capacitor 13 being fixed in order to take into account the angle of view of the photosite associated with the relevant input stage. In order to vary the capacitance of this capacitor from one input stage to the other, the surface area of the component electrodes of said capacitor is modified.

Figure 5:
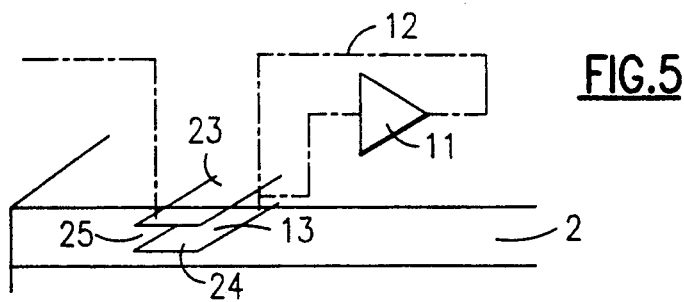

FIG. 5 represents the technological embodiment of the basic diagram of FIG. 4. The capacitor 13 is embodied with two electrodes 23, 24 separated by a dielectric 25. By thus varying the surface area of said electrodes 23, 24 from one input stage to the next, the capacitance of the capacitor 13 is modified and consequently a variable gain is imparted from each input stage to the next.

The various technological embodiments do not influence the implementation of the invention except at the level of the desired choice of quantity which it is subsequently wished to work on.

As already mentioned, circuits with large dimensions are particularly affected by continuous difference response gradients, the difference in field of view between a central photosite and an end photosite increasing with distance. Furthermore, certain circuits have dimensions such that it is no longer possible to produce them in a monolithic manner either because of the non-availability of material of sufficiently large dimensions, or because the difficulties in processing detection or readout chips of very large sizes at all levels are too great, particularly with regard to their handling, their interconnection and the difficulties associated with assembly, and finally because of their reduced efficiency.

Figure 6:
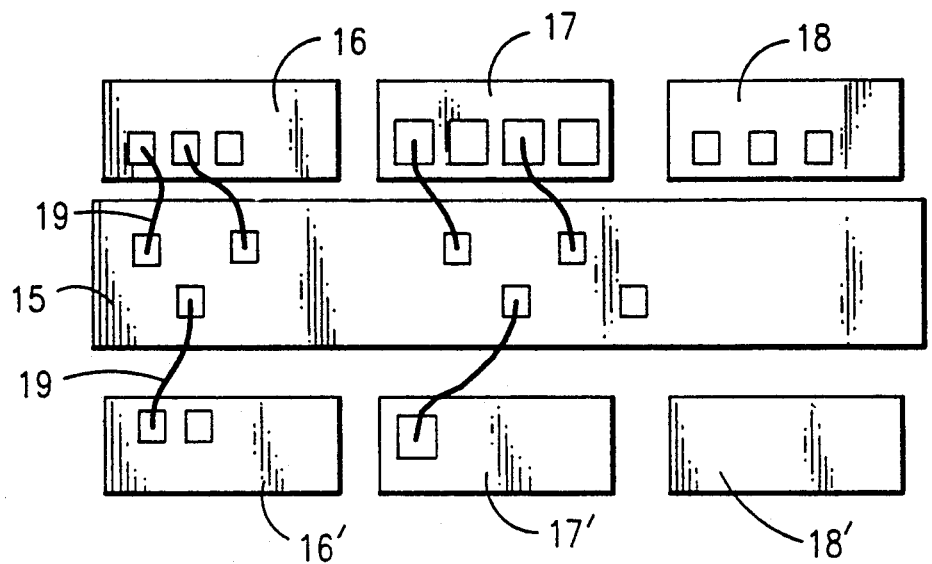
FIG. 6 is a diagrammatical representation of one embodiment of the invention.
Figure 7:
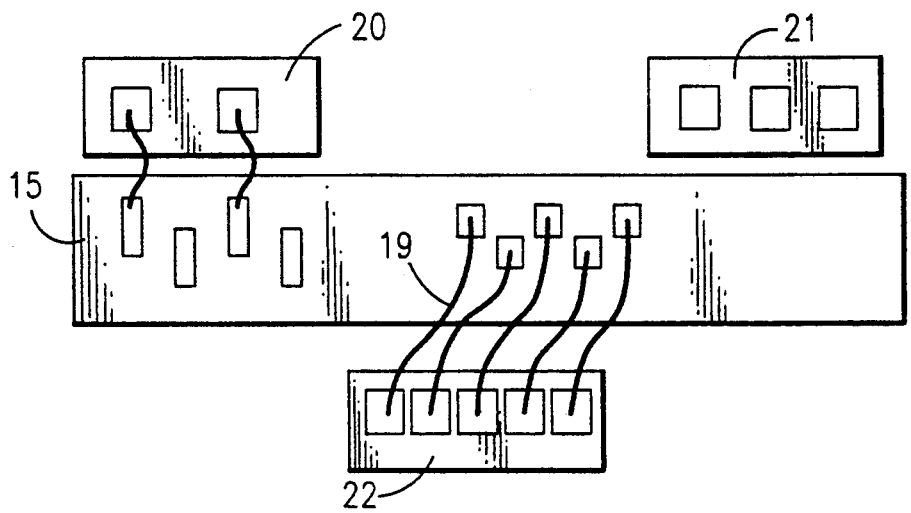
FIG. 7 is a diagrammatical representation of another embodiment of the invention.

In an application of the invention such as shown in FIGS. 6 and 7, the detection and/or readout circuits are constituted by juxtaposed elementary chips of reduced size whose quantity is adapted as a function of the final circuit to be produced. In fact, these elementary chips can be positioned end-to-end (FIG. 6), or staggered (FIG. 7), their interconnection with the readout circuit being carried out by any known method, such as for example by soldered wire connections, or collective hybridizing by metallic micro-spheres.

It therefore proves economical in certain cases to carry out the continuous level corrections, by means of the method according to the invention, using elementary chips of a readout circuit, whose gain functions are constant on each of the chips in question, but different from one chip to another.

Thus in FIGS. 6 and 7 there is shown a monolithic detection circuit 15 constituted from a linear array which can include more than a thousand photosites and can have a length which is typically on the order of 20 millimeters.

There have been shown, in association with this detection circuit 15, six chips 16, 16', 17, 17', 18, 18' of a readout circuit, pairs in identical this latter characteristic being in no way imperative. These chips 16–18' are distributed on either side of the detection circuit 15, and are interconnected with the latter by means of conductive wires 19.

The method according to the invention is then implemented by varying the capacitances participating in establishing the gain of the input stages of the central chips 17, 17', with respect to the lateral chips 16, 16', 18, 18', in this way inducing an adaption of the gain in respect of the section of the detection circuit which they manage.

In FIG. 7 there is shown an embodiment similar to that previously described and in which the chips 20, 21, 22 are positioned in a staggered arrangement with respect to each other.

Thus, although the implementation of the invention may not be absolutely efficient for correction from one photosite to another, it does on the other hand have an economic advantage of using readout chips of simpler design and also of achieving an optimum gain control more economically by successive tests of interchangeable circuits with different gains.

The system and the assembly thus embodied achieve electro-optical detector characteristics which do not fluctuate, which are consistent, and which can be directly exploited by a processing system associated with the readout circuit. They are therefore particularly suited to the processing of signals generated by any detector system coupled to a readout circuit of the multiplexer type.

While the invention has been described in detail with respect to certain preferred embodiments, it will be apparent to those skilled in the art that many modifications and variations are possible without departing from the invention, which is defined in the ensuing claims.

What is claimed is:

1. An exploiting circuit that is coupled to an associated detection system formed of a plurality of photodetectors that are arranged in a linear or matrix array, each photodetector having a respective field of view which depends on its position in the array and each said photodetector providing an electrical signal dependent on incident photon flux which the photodetector receives, with the photo flux being a function of the angle of view of the photodetector; said exploiting circuit functioning to homogenize a continuous response of the detection system and comprising as many input stages as there are photodetectors in the detection system, with each said input stage receiving the electrical signal from a corresponding one of the photodetectors, and wherein each of the input stages has a predetermined gain selected in respect to the associated corresponding photodetector to which it is coupled, and the gains of the input stages relative to one another, are selected as a function of the field of view of their respective photodetectors.

2. The exploiting circuit according to claim 1 wherein the predetermined gain of each said exploiting circuit input stage is selected so that the product of said gain times the solid angle of view of the associated photodetector is a constant for all of the exploiting circuit input stages.

3. The exploiting circuit according to claim 1 wherein each said input stage includes a capacitor storing a charge determined by the value of the input signal produced by the associated photodetector with which it is connected; and the capacitors of the respective input stages have their values selected as a function of the field of view of the associated photodetectors.

4. The exploiting circuit according to claim 3 wherein each said capacitor has at least one electrode, and the capacitor values are determined by selecting surface areas of the electrodes as a function of the field of view of the respective photodetectors.

5. An exploiting circuit that is coupled to an associated detection system formed of a plurality of photodetectors that are arranged in a linear or matrix array, each photodetector having a respective field of view which depends on its position in the array and each said photodetector providing an electrical signal dependent upon incident photon flux which the photodetector receives, with the photon flux being a function of the field of view of the photodetector; said exploiting circuit functioning to homogenize a continuous response of the detection system and comprising as many input stages as there are photodetectors of the detection system, with each input stage receiving the electrical signal from a corresponding one of the photodetectors and wherein each of said input stages has a predetermined gain selected in respect to the associated corresponding photodetector to which it is coupled; said exploiting circuit consisting of a charge-coupled device wherein each input stage is formed of a first and a second storage electrode separated by a dividing electrode, wherein the first and second storage electrode for each said input stage have respective surface areas selected as a function of the field of view of the associated photodetector.

6. The exploiting circuit according to claim 5 wherein the surface areas $S_5$ and $S_7$ of the first and second storage electrodes are selected relative to the field of view $\Theta$ of the associated photodetector in a relationship such that the product $$\Theta \times \frac{S_5}{S_5 + S_7}$$

is a constant for all such input stages.

7. An exploiting circuit that is coupled to an associated detection system formed of a plurality of photodetectors that are arranged in a linear or matrix array, each photodetector having a respective field of view which depends on its position in the array and each said photodetector providing an electrical signal dependent upon incident photon flux which the photodetector receives, with the photon flux being a function of the field of view of the photodetector; said exploiting circuit functioning to homogenize a continuous response of the detection system and comprising as many input stages as there are photodetectors of the detection system, with each input stage receiving the electrical signal from a corresponding one of the photodetectors and wherein each of said input stages has a predetermined gain selected in respect to the associated corresponding photodetector to which it is coupled; wherein said exploiting circuit is a CMOS circuit and each said input stage thereof includes a negative feedback loop formed of an operational amplifier and a feedback capacitor having a fixed capacitance which is specifically selected for the respective input stage, wherein the capacitors for each of said input stages are selected as a function of the field of view of the photodetector to which the respective input stage is coupled.

8. The exploiting circuit according to claim 7 wherein said feedback capacitors are formed of component electrodes of selected surface areas, and the capacitances thereof are selected so as to vary from one said input stage to the next by varying the surface area of the component electrode from one said feedback capacitor to the next.

* * * * *